(12) United States Patent
Wang et al.

(10) Patent No.: US 11,307,260 B2
(45) Date of Patent: Apr. 19, 2022

(54) TESTING SYSTEM FOR SAFE OPERATING WINDOW OF LITHIUM-ION BATTERY IN SQUEEZED STATE AND TESTING METHOD THEREOF

(71) Applicant: NANJING TECH UNIVERSITY, Jiangsu (CN)

(72) Inventors: Zhirong Wang, Jiangsu (CN); Jinlong Bai, Jiangsu (CN); Jia Ju, Jiangsu (CN); Yangyan Zheng, Jiangsu (CN)

(73) Assignee: NANJING TECH UNIVERSITY, Jiangsu (CN)

( * ) Notice: Subject to any disclaimer, the term of this patent is extended or adjusted under 35 U.S.C. 154(b) by 0 days.

(21) Appl. No.: 17/227,366

(22) Filed: Apr. 11, 2021

(65) Prior Publication Data
US 2021/0318384 A1 Oct. 14, 2021

(30) Foreign Application Priority Data
Apr. 13, 2020 (CN) .......................... 202010284197.1

(51) Int. Cl.
*G01R 31/378* (2019.01)
*G01R 31/3842* (2019.01)
*G01R 31/36* (2020.01)
*G01N 3/14* (2006.01)

(52) U.S. Cl.
CPC .............. *G01R 31/378* (2019.01); *G01N 3/14* (2013.01); *G01R 31/3648* (2013.01); *G01R 31/3842* (2019.01)

(58) Field of Classification Search
CPC .............. G01R 31/378; G01R 31/3648; G01R 31/3842; G01N 3/14
See application file for complete search history.

(56) References Cited

U.S. PATENT DOCUMENTS

| | | | |
|---|---|---|---|
| 2020/0072908 A1* | 3/2020 | Yu | G01R 31/378 |
| 2020/0106137 A1* | 4/2020 | Murphy | H01M 10/425 |
| 2020/0132577 A1* | 4/2020 | Kwon | G01N 3/20 |
| 2020/0271731 A1* | 8/2020 | Sugaya | H01M 10/425 |

FOREIGN PATENT DOCUMENTS

| | | |
|---|---|---|
| CN | 208672455 | 3/2019 |
| CN | 209486268 | 10/2019 |

* cited by examiner

*Primary Examiner* — Jeff W Natalini
(74) *Attorney, Agent, or Firm* — JCIP Global Inc.

(57) ABSTRACT

The present invention discloses a testing method and a testing system for a safe operating window of a lithium-ion battery in a squeezed state. The testing system includes a mechanical loading device, a heating device, a lithium-ion battery tester and a measuring device. By comparing the influence of a combined use of two or more of mechanical abuse with two different fixed variables, thermal abuse, and electrical abuse on critical conditions of thermal runaway of the lithium-ion battery, the influence of the different forms of abuse on the critical conditions of thermal runaway of the lithium-ion battery can be compared qualitatively and quantitatively, and these data can also be used to determine the safe operating windows of the lithium-ion battery under different abuse conditions.

14 Claims, 5 Drawing Sheets

TESTING SYSTEM FOR SAFE OPERATING WINDOW OF LITHIUM-ION BATTERY IN SQUEEZED STATE AND TESTING METHOD THEREOF

CROSS-REFERENCE TO RELATED APPLICATION

This application claims the priority benefit of China application serial no. 202010284197.1, filed on Apr. 13, 2020. The entirety of the above-mentioned patent application is hereby incorporated by reference herein and made a part of this specification.

BACKGROUND

Technical Field

The present invention belongs to the technical field of lithium-ion batteries, and specifically, relates to a testing method for a safe operating window of a lithium-ion battery in a squeezed state.

Description of Related Art

Lithium-ion batteries, as current energy storage batteries with a relatively high energy density, are widely used in various electric tools, electric vehicles and various portable devices. Due to the properties of lithium-ion batteries, heat is likely to accumulate in the lithium-ion batteries during charging, discharging and use, and some hidden defects in the lithium-ion batteries may be caused during production. Such hidden defects will lead to thermal runaway of the lithium-ion batteries under abnormal environmental conditions such as mechanical abuse, thermal abuse, and electrical abuse, causing self-ignition and explosion of the lithium-ion batteries, and therefore seriously threatening the lives and property safety of the people. Such abuse conditions refer to critical conditions under which a lithium-ion battery undergoes a thermal runaway under the action of thermal load, electrical load and/or mechanical load. The thermal load, mechanical load, and electrical load act on the lithium-ion battery alone or in a combination of two or more thereof to cause the critical conditions for the thermal runaway of the lithium-ion battery to constitute a safe operating window of the lithium-ion battery.

The safe operating window of the lithium-ion battery is affected by the coupling of multiple factors. To determine the safe operating window in a mechanical squeezed state, the thermal abuse and electrical abuse in the mechanical squeezed state need to be considered comprehensively.

At present, there are many researches on the safety boundaries of thermal abuse and electrical abuse of lithium-ion batteries. A large number of studies have been conducted on the critical conditions of thermal runaway of lithium-ion batteries when these two forms of abuse are applied to lithium-ion batteries alone or at the same time. Experimental schemes have been designed for these two forms of abuse, and the safe operating windows of lithium-ion batteries under these two abuse situations have been obtained.

Most of studies regarding the mechanical abuse of lithium-ion batteries focus on the failure boundary of failure of lithium-ion batteries and the thermal runaway boundary conditions of thermal runaway of lithium-ion batteries caused by mechanical abuse alone. The critical conditions of thermal runaway of lithium-ion batteries under the coupling effect of mechanical abuse and other forms of abuse have not been studied, that is to say, mechanical abuse has not been taken into consideration together with other forms of abuse, and the influence of the combination of mechanical abuse and other forms of abuse on the critical conditions of thermal runaway of lithium-ion batteries has not been studied. In the prior art, it is difficult to fix the severity of mechanical abuse by using an existing mechanical abuse testing device for lithium-ion batteries, making it impossible to study, on the premise of a fixed level of mechanical abuse, the influence of other forms of abuse on the safe operating windows of lithium-ion batteries. The reason why the severity of mechanical abuse is difficult to fix lies in that, unlike other objects to be tested in a mechanical test, lithium-ion batteries will undergo complex chemical changes under thermal and electrical load conditions, and such chemical changes will lead to changes in the thickness and the magnitude and distribution of internal stress of lithium-ion batteries, but traditional mechanical testing devices cannot keep a mechanical load applied on the lithium-ion battery unchanged under such complex conditions. Because a small variation of the external mechanical load may have great impact on the chemical changes inside the lithium-ion battery, the mechanical loads applied need to be precisely regulated. High-precision machine tools can ensure that the mechanical deformation of the lithium-ion battery remains relatively stable, but high-precision machine tools are not developed for lithium-ion battery testing and require an operating environment where no explosion occurs. However, the lithium-ion battery will explode and burn in the case of thermal runaway, causing damage to the expensive high-precision machine tools. In addition, high-precision machine tools cannot fix the pressure inside the lithium-ion battery, because the thickness of the lithium-ion battery will change under thermal load and electrical load. Due to the complex and fine internal structure of the lithium-ion battery, a slight structural deformation will cause great stress inside the internal structure of the battery. Therefore, high-precision machine tools can only fix the amount of deformation, not the pressure applied.

However, in actual use, there are cases where lithium-ion batteries need to operate under mechanical loads, and because lithium-ion batteries are sensitive to mechanical loads, an external mechanical load will lead to a deformation of the internal structure of the lithium-ion battery, increased internal pressure and increased internal local stress, which is unfavorable to the normal operation of the lithium-ion battery, resulting in the shrinking of the safe operating window of the lithium-ion battery.

Therefore, it is very necessary to design a cost-effective, reusable device and system specifically used for mechanical testing of lithium-ion batteries, so as to meet the requirements of studying the safe operating windows of lithium-ion batteries under the combined action of mechanical abuse, thermal abuse, and electrical abuse.

SUMMARY

An object of the present invention is to provide a testing method for a safe operating window of a lithium-ion battery in a squeezed state, to solve the technical problems in the prior art. Most of studies regarding the mechanical abuse of lithium-ion batteries focus on the failure boundary of failure of lithium-ion batteries and the thermal runaway boundary conditions of thermal runaway of lithium-ion batteries caused by mechanical abuse alone; and neither the critical conditions of thermal runaway of lithium-ion batteries under the coupling effect of mechanical abuse and other forms of abuse have been studied, nor the influence of the combination of mechanical abuse and other forms of abuse on the critical conditions of thermal runaway of lithium-ion batteries has been studied.

To achieve the above object, the following specific technical solutions are adopted in the present invention.

A testing system for a safe operating window of a lithium-ion battery in a squeezed state includes a mechanical loading device, a heating device, a lithium-ion battery tester and a measuring device.

The mechanical loading device includes a base, an extrusion punch, a clamping claw plate, and a pressure applying mechanism arranged on the base. The clamping claw plate is configured to clamp the extrusion punch. The pressure applying mechanism is configured to apply pressure to a lithium-ion battery through the extrusion punch.

The heating device includes a heating plate and a proportional-integral-derivative (PID) temperature controller. The PID temperature controller is connected to the heating plate by a wire. The heating plate is located on the base. The lithium-ion battery is placed on the heating plate. A thermal load is achieved on the lithium-ion battery through the configuration of the heating plate.

The lithium-ion battery tester is connected to positive and negative electrodes of the lithium-ion battery by wires. An electrical load is loaded on the lithium-ion battery through the configuration of the lithium-ion battery tester.

The measuring device includes a first thermocouple configured to measure temperature of the lithium-ion battery, a laser distance sensor configured to measure a compressional deformation of the lithium-ion battery, a pressure sensor configured to measure a pressure value experienced by the lithium-ion battery, a data acquisition device, and a computer. The first thermocouple, the laser distance sensor, and the pressure sensor are all connected to the data acquisition device by wires. The lithium-ion battery tester and the data acquisition device are connected to the computer by wires.

By the configuration of the test system, the present invention can load a thermal load and an electrical load on the lithium-ion battery when the lithium-ion battery is in a state with a fixed mechanical load, and allows for the adjustment of one or more of the mechanical load, the thermal load, and the electrical load so as to measure the thermal runaway time, temperature change, thickness change, weight change and other parameters of the lithium-ion battery under different abuse conditions, and qualitatively and quantitatively analyze whether the lithium-ion battery undergoes a thermal runaway under different abuse conditions as well as the degree of thermal runaway. Through a large number of experiments, data on the critical conditions of thermal runaway of the lithium-ion battery can be obtained, and then the safe operating window for thermal runaway of the lithium-ion battery and hazards of thermal runaway can be quantitatively determined, which can more scientifically reflect the safe operating window of the lithium-ion battery under real situations, thereby achieving a comprehensive study of the influence of the coupling action of mechanical load, thermal load, and electrical load on the safe operating windows of lithium-ion batteries, providing a more scientific basis for studying the dangers of thermal runaway of lithium-ion batteries and developing lithium-ion battery protection measures, providing reliable data support for the determination of conditions for the safe use of lithium-ion batteries, and filling the gap in the study of the thermal runaway law and thermal runaway critical conditions of lithium-ion batteries under the coupling action of mechanical abuse and other forms of abuse in the current research field on the dangers of thermal runaway of lithium-ion batteries. Through a large number of experiments, the thermal runaway critical conditions of lithium-ion batteries under the coupling effect of various forms of abuse can be obtained, and the safe operating windows of lithium-ion batteries can be derived.

As a further improvement, the clamping claw plate includes a first half and a second half separated from each other, the first half and the second half form an inverted U-shaped slot after being fitted together, inner walls of two sides of the slot are each provided with a protrusion. The extrusion punch is provided with grooves, an upper part of the extrusion punch is embedded in the slot, and the protrusions are engaged in the corresponding grooves. The first half and the second half are provided with connecting through holes, respectively, and a bolt is passed through the connecting through holes and then connected to a nut to fasten the extrusion punch and the clamping claw plate together. In this way, a firm connection and high structural stability are achieved, and the detachable connection between the extrusion punch and the clamping claw plate facilitates the mounting, removal, and replacement of the extrusion punch. The first half and the second half are symmetrically arranged with respect to the assembly center line, thereby reducing errors and improving the test precision.

As a further improvement, to test a safe operating window of the lithium-ion battery in a squeezed state with a fixed mechanical pressure, the pressure applying mechanism includes a weight, a tray, a main shaft, at least one limit sleeve and a support. The support is fixedly connected to the base, the limit sleeve is arranged on the support, the main shaft is movably connected to the support by the limit sleeve, the main shaft is arranged vertically, the main shaft is movable up and down along the support, an upper end of the main shaft is connected to the tray, and the weight is placed in the tray. A lower end of the main shaft and the first half of the clamping claw plate are fixedly connected to each other and are integrally formed. By placing a weight with a fixed weight in the tray to cause the main shaft to move downward relative to the support, the squeezing of the lithium-ion battery by a fixed mechanical pressure is realized. The center of gravity of the mechanical loading device is located on the axis of the main shaft, which reduces the friction between the main shaft and the limit sleeve and improves the test precision.

As a further improvement, the limit sleeve is a sliding bearing, which is low in cost, easy to install, and has low friction. The number of limit sleeves is two to ensure that the center of gravity of the main shaft does not shift during the vertical movement.

As a further improvement, to test a safe operating window of the lithium-ion battery in a squeezed state with a fixed mechanical deformation, the pressure applying mechanism includes a top plate, at least two screws vertically arranged, one driving gear, and driven gears. The number of the driven gears is the same as that of the screws. A lower end of each of the screws is fixedly connected to the base, the top plate is provided with first mounting holes, the number of the first mounting holes is the same as that of the screws, the top plate is sleeved on the screws through the first mounting holes, and each of the screws extends through a corresponding first mounting hole. A bottom surface of the top plate is fixedly connected to the first half of the clamping claw plate, and the top plate and the first half of the clamping claw plate are integrally formed. A center of each of the driven gears is provided with a threaded hole, each of the driven gears is sleeved on a corresponding screw through the threaded hole, the driven gears are located on the top plate and are rotatably connected to the top plate, and the driving gear meshes with all the driven gears. By rotating the driving gear to drive all the driven gears to rotate synchronously, the uniform downward movement of the top plate is realized, thereby realizing the squeezing of the lithium-ion battery under the fixed mechanical deformation.

As a further improvement, the numbers of the screws, the driven gears and the first mounting holes are all four. The four driven gears are evenly distributed around the driving gear. The configuration of one driving gear and multiple driven gears ensures that each side of the top plate has the same downward movement speed and the same degree of downward movement during the downward movement, thereby improving the test precision.

As a further improvement, an edge of the threaded hole of each of the driven gears protrudes downward and extends to form a connecting sleeve, and the connecting sleeve is inserted into the corresponding first mounting hole and is rotatably connected to the top plate by a rolling bearing, where an inner ring of the rolling bearing is fixedly sleeved on the connecting sleeve, and an outer ring of the rolling bearing is engaged in the first mounting hole. The rotatable connection between the driven gears and the top plate reduces the friction between the driven gears and the top plate, thereby reducing energy consumption and improving the operability.

As a further improvement, the connecting sleeve includes an upper sleeve and a lower sleeve, where an inner hole of the upper sleeve is a threaded hole and is threadedly connected to the corresponding screw, and the rolling bearing is sleeved on the upper sleeve. The lower sleeve extends out of the top plate, an inner hole of the lower sleeve is an unthreaded hole having a diameter larger than a diameter of the inner hole of the upper sleeve, an outer wall of the lower sleeve is provided with an external thread, a limit cap is sleeved on the lower sleeve, and the limit cap is threadedly connected to the lower sleeve, to prevent detachment of the driven gears and the top plate, thereby improving the structural stability.

As a further improvement, a center of a bottom of the driving gear protrudes downward to form a cylindrical connecting body, an upper surface of the top plate is recessed at a position corresponding to the cylindrical connecting body to form a cylindrical cavity, the cylindrical connecting body is inserted into the cylindrical cavity, the cylindrical connecting body and the cylindrical cavity are in sliding friction with each other at an interface therebetween where a lubricant is used for lubrication to reduce the friction, and the driving gear is rotatably connected to the top plate.

As a further improvement, a lower end of the extrusion punch is provided with a second mounting hole, the first thermocouple is arranged in the second mounting hole to facilitate fixed mounting, and during testing, the first thermocouple is in contact with a surface of the lithium-ion battery, where the contact point is the center point of the lithium-ion battery under pressure. The second half of the clamping claw plate extends horizontally outward to form a wing having a light shielding function, the laser distance sensor is fixedly arranged on the base, and a laser emitted from an emitting end of the laser distance sensor is reflected by the wing and then received by a receiving end of the laser distance sensor, so as to measure an amount of deformation of the lithium-ion battery under pressure.

As a further improvement, an upper surface of the base is provided with a recess, the heating plate and the pressure sensor are embedded in the recess, the heating plate is located above the pressure sensor, and a heat insulating layer is arranged between the heating plate and the pressure sensor, to prevent the pressure sensor from overheating to affect the test results. An edge of the heating plate is folded upward to form a limit flange, and the lithium-ion battery is arranged on the heating plate and is fixed by the limit flange, to prevent the lithium-ion battery from displacement during the pressure loading process to affect the test accuracy.

A testing method based on the testing system for a safe operating window of a lithium-ion battery in a squeezed state, including the following steps.

1) Placing a lithium-ion battery on the heating plate, and connecting positive and negative electrodes of the lithium-ion battery to the lithium-ion battery tester, to implement synchronous current and voltage monitoring in a case where the lithium-ion battery is loaded with a fixed electrical load. Connecting the heating plate to a power supply and the PID temperature controller, and connecting the second thermocouple inside the heating plate to the PID temperature controller. Connecting the pressure sensor and the laser distance sensor to the data acquisition device. Connecting the extrusion punch assembled with the first thermocouple to the clamping claw plate, placing same on a surface of the lithium-ion battery, connecting the first thermocouple to the data acquisition device, connecting the data acquisition device and the lithium-ion battery tester to the computer, and recording real-time measured values of the laser distance sensor and the pressure sensor that are respectively displayed on the computer.

2) Testing influence of a fixed mechanical pressure on the safe operating window of the lithium-ion battery: calculating a weight of the weight to be placed on the tray according to a value of pressure that needs to be applied, by using the following calculation formula:

$$M = \frac{p \cdot S}{g} - m \quad (1)$$

Wherein, M is the weight of the weight to be selected, p is the value of the pressure that needs to be applied, S is the contact area between the lithium-ion battery and the extrusion punch and is known, g is the acceleration of gravity and is known, and m is a sum of weights of the main shaft, the extrusion punch, the clamping claw plate, the bolt, and the tray, and is known.

2.1) Testing influence of a combined action of mechanical abuse and thermal abuse on the safe operating window of the lithium-ion battery in the state with the fixed mechanical pressure:

Turning on the heating plate by using the PID temperature controller, adjusting a set heating temperature of the PID temperature controller according to settings, and testing a surface temperature of the lithium-ion battery during the entire test by using the first thermocouple. Testing, by using the laser distance sensor, a variation in a relative distance between the clamping claw plate and the base caused by a change in thickness of the lithium-ion battery during the entire test; testing, by using the pressure sensor, a pressure variation during the entire test, where the pressure variation is used for calculating a change in weight of the lithium-ion battery during the test.

2.2) Testing influence of a combined action of mechanical abuse and electrical abuse on the safe operating window of the lithium-ion battery in the state with the fixed mechanical pressure:

Turning on the lithium-ion battery tester, performing four electrical abuses including high-rate charging, high-rate discharging, overcharging and overdischarging respectively on the lithium-ion battery according to settings, recording a surface temperature of the lithium-ion battery during the test by using the first thermocouple, recording, by using the laser distance sensor, a change in the relative distance between the clamping claw plate and the base caused by a change in thickness of the lithium-ion battery during the test, and recording a pressure variation during the test by using the pressure sensor, where the pressure variation is used for calculating a change in weight of the lithium-ion battery during the test.

2.3) Testing influence of a combined action of mechanical abuse, electrical abuse, and thermal abuse on the safe operating window of the lithium-ion battery in the state with the fixed mechanical pressure:

Designing experimental schemes for electrical abuse values, heating power, and heating temperature of high-rate charging, high-rate discharging, overcharging and overdischarging according to requirements, setting the lithium-ion battery tester and the PID temperature controller according to parameters of the experimental schemes, then carrying out experiments, recording a surface temperature of the lithium-ion battery during the test by using the first thermocouple, recording, by using the laser distance sensor, a change in the relative distance between the clamping claw plate and the base caused by a change in thickness of the lithium-ion battery during the test, and recording a pressure variation during the test by using the pressure sensor, where the pressure variation is used for calculating a change in weight of the lithium-ion battery during the test.

3) Testing influence of a fixed mechanical deformation of the lithium-ion battery on the safe operating window of the lithium-ion battery. Rotating the driving gear, adjusting feed of the driven gears to adjust a relative variation of a distance of the laser distance sensor so that a mechanical deformation of the lithium-ion battery reaches a target value, and then starting to test a thermal runaway boundary of the lithium-ion battery under the fixed mechanical deformation.

3.1) Testing influence of a combined action of mechanical abuse and thermal abuse on the safe operating window of the lithium-ion battery in a state with a fixed mechanical deformation:

Turning on the heating plate by using the PID temperature controller, adjusting the set heating temperature of the PID temperature controller according to settings, and testing a surface temperature of the lithium-ion battery during the entire test by using the first thermocouple; recording, by using the pressure sensor, a pressure variation during the test, where the pressure variation is used for analyzing a strain caused by chemical reactions inside the lithium-ion battery during the test.

3.2) Testing influence of a combined action of mechanical abuse and electrical abuse on the safe operating window of the lithium-ion battery in the state with the fixed mechanical deformation:

Turning on the lithium-ion battery tester, performing four electrical abuses including high-rate charging, high-rate discharging, overcharging and overdischarging respectively on the lithium-ion battery according to settings, recording a surface temperature of the lithium-ion battery during the test by using the first thermocouple; recording, by using the pressure sensor, a pressure variation during the test, where the pressure variation is used for analyzing a strain caused by chemical reactions inside the lithium-ion battery during the test.

3.3) Testing influence of a combined action of mechanical abuse, electrical abuse, and thermal abuse on the safe operating window of the lithium-ion battery in the state with the fixed mechanical deformation:

Designing experimental schemes for electrical abuse values, heating power, and heating temperature of high-rate charging, high-rate discharging, overcharging and overdischarging according to requirements, setting the lithium-ion battery tester and the PID temperature controller according to parameters of the experimental schemes, then carrying out experiments, recording a surface temperature of the lithium-ion battery during the test by using the first thermocouple, and recording a pressure variation during the test by using the pressure sensor, where the pressure variation is used for analyzing a strain caused by chemical reactions inside the lithium-ion battery during the test.

Compared with the prior art, the present invention has the following beneficial effects.

By the configuration of the test system, the present invention can load a thermal load and an electrical load on the lithium-ion battery when the lithium-ion battery is in a state with a fixed mechanical load, and allows for the adjustment of one or more of the mechanical load, the thermal load, and the electrical load so as to measure the thermal runaway time, temperature change, thickness change, weight change and other parameters of the lithium-ion battery under different abuse conditions, and qualitatively and quantitatively analyze whether the lithium-ion battery undergoes a thermal runaway under different abuse conditions as well as the degree of thermal runaway. Through a large number of experiments, data on the critical conditions of thermal runaway of the lithium-ion battery can be obtained, and then the safe operating window for thermal runaway of the lithium-ion battery and hazards of thermal runaway can be quantitatively determined, which can more scientifically reflect the safe operating window of the lithium-ion battery under real situations, thereby achieving a comprehensive study of the influence of the coupling action of mechanical load, thermal load, and electrical load on the safe operating windows of lithium-ion batteries, providing a more scientific basis for studying the dangers of thermal runaway of lithium-ion batteries and developing lithium-ion battery protection measures, providing reliable data support for the determination of conditions for the safe use of lithium-ion batteries, and filling the gap in the study of the thermal runaway law and thermal runaway critical conditions of lithium-ion batteries under the coupling action of mechanical abuse and other forms of abuse in the current research field on the dangers of thermal runaway of lithium-ion batteries. Through a large number of experiments, the thermal runaway critical conditions of lithium-ion batteries under the coupling effect of various forms of abuse can be obtained, and the safe operating windows of lithium-ion batteries can be derived.

DESCRIPTION OF THE EMBODIMENTS

The technical solutions in the embodiments of the present invention will be described clearly and fully with reference to the accompanying drawings in the embodiments of the present invention.

Embodiment 1

Figure 1:
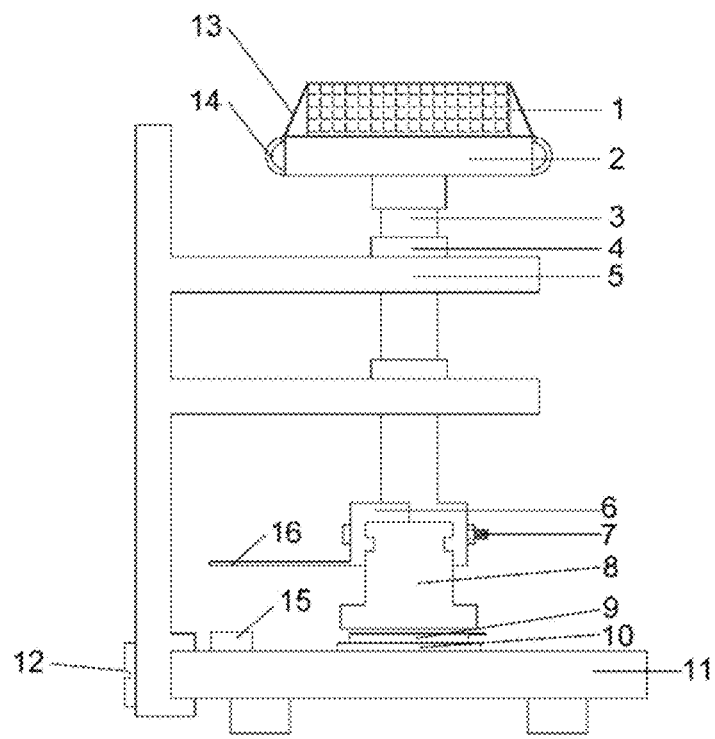
FIG. 1 is a schematic structural front view of a mechanical loading device according to Embodiment 1 of the present invention.
Figure 2:
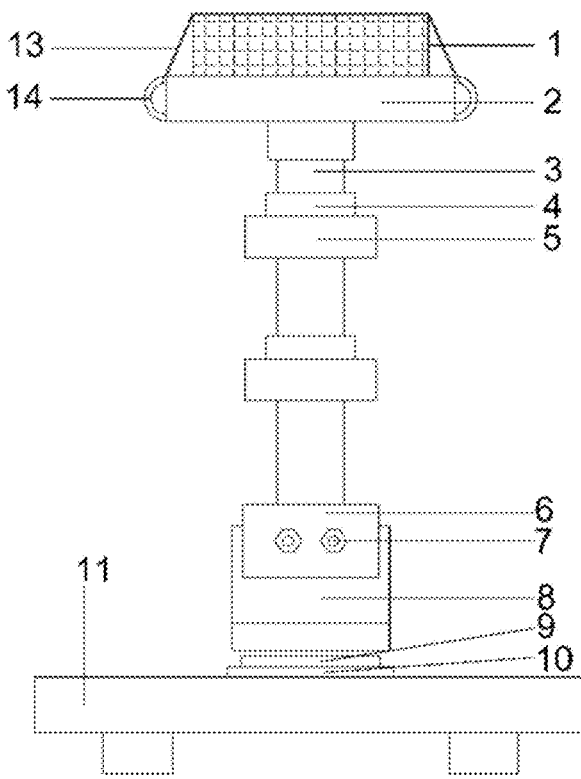
FIG. 2 is a right side view of FIG. 1.
Figure 3:
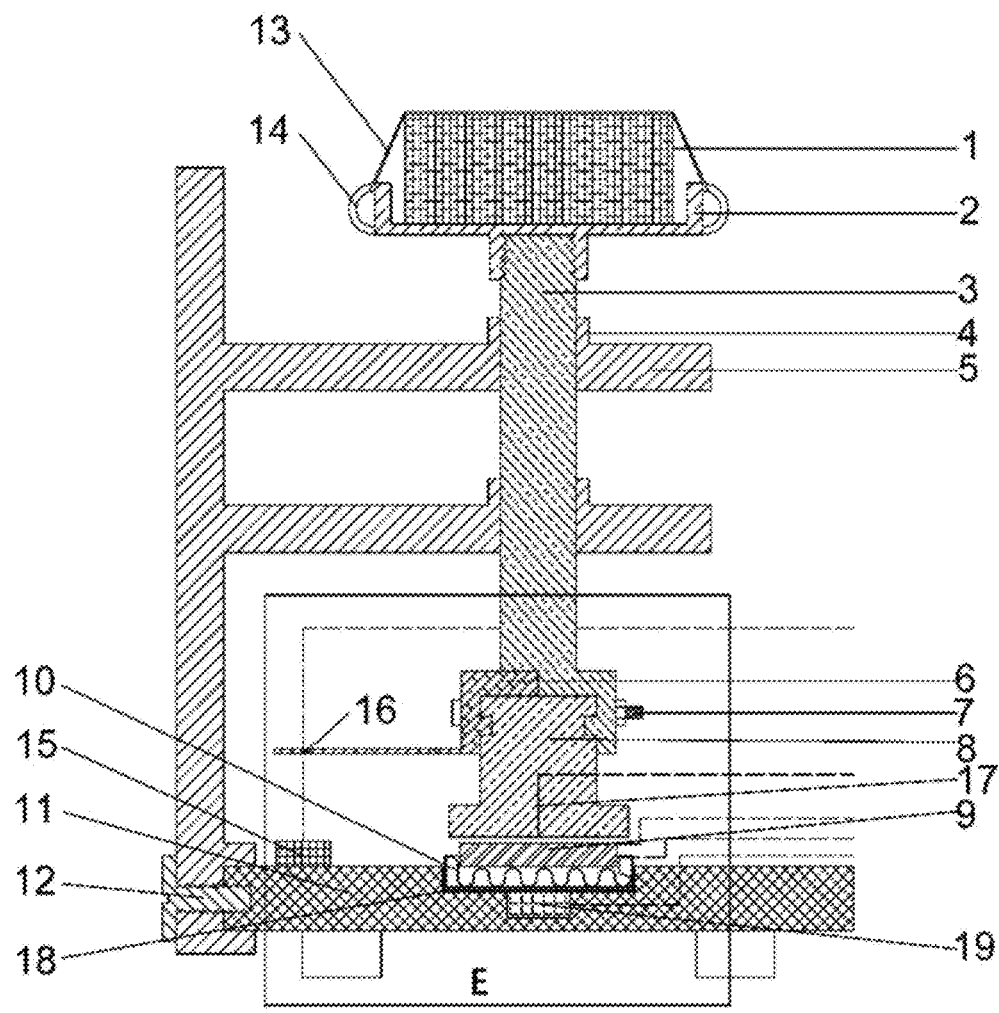
FIG. 3 is a cross-sectional view of FIG. 1.

Referring to FIG. 1 to FIG. 3, a testing system for a safe operating window of a lithium-ion battery in a squeezed state with a fixed mechanical pressure includes a mechanical loading device, a heating device, a lithium-ion battery tester, and a measuring device. The mechanical loading device includes a weight 1, a tray 2, a main shaft 3, a limit sleeve 4, a support 5, a clamping claw plate 6, a bolt 7, an extrusion punch 8, and a base 11. The heating device includes a heating plate 10 and a PID temperature controller 27 for controlling the heating plate 10. A lithium-ion battery tester 26 is connected to a lithium-ion battery 9 by a wire. The measuring device includes a first thermocouple 17 connected to the lithium-ion battery 9, a laser distance sensor 15, a pressure sensor 19, and a data acquisition device 28 and a computer 29 which are connected to these sensors.

Figure 4:
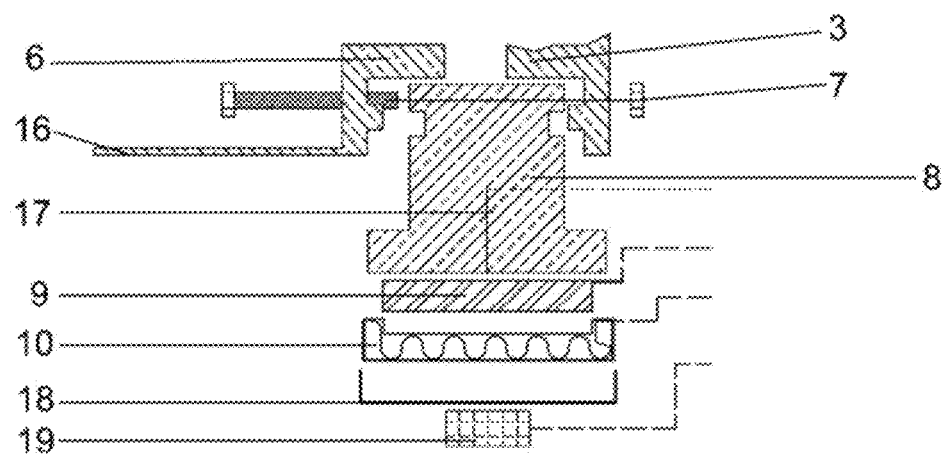
FIG. 4 is a structural exploded view of area E in FIG. 3.
Figure 5:
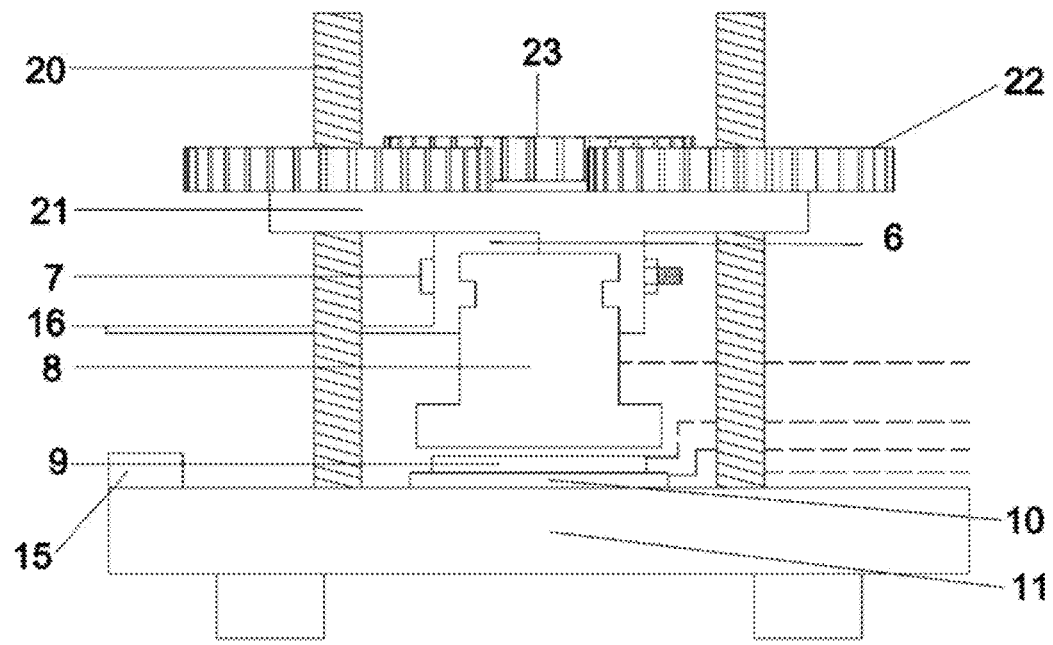
FIG. 5 is a schematic structural front view of a mechanical loading device according to Embodiment 2 of the present invention.
Figure 6:
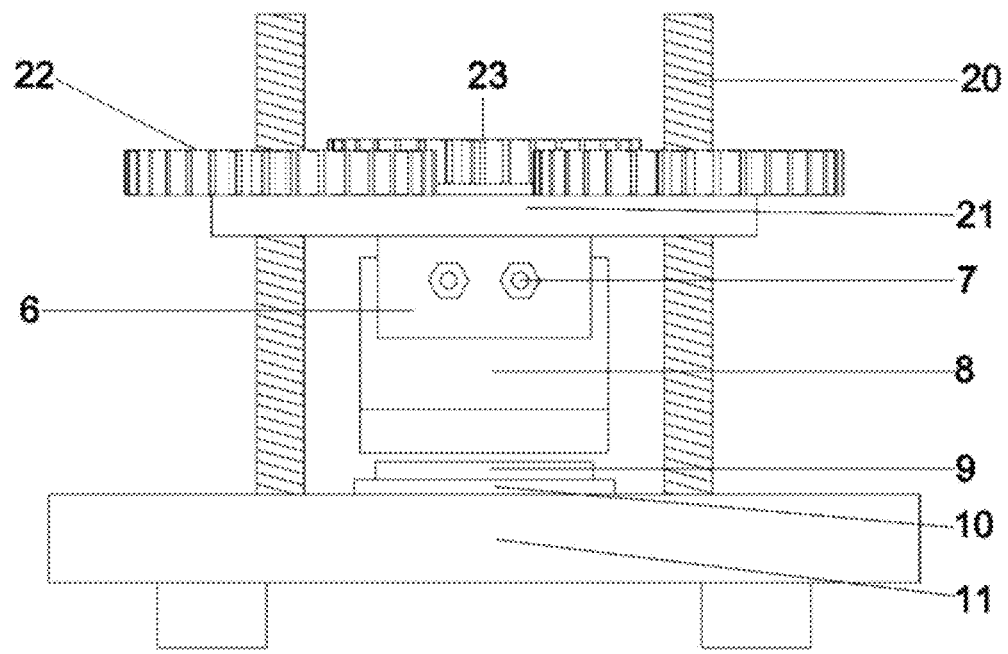
FIG. 6 is a right side view of FIG. 5.

Referring to FIG. 3 to FIG. 4, the weight 1 is placed on the tray 2 and fixed to the tray 2 by an elastic cable tie 13 and a cable tie fixing ring 14 to prevent the weight 1 from falling due to the vibration produced during explosion and burning of the lithium-ion battery 9 caused by thermal runaway. The tray 2 is threadedly connected to an upper end of the main shaft 3. The support 5 is fixed to the base 11 by a quick-release screw 12, which facilitates the removal of the support 5 and the main shaft 3 to clean up the pollution caused by the thermal runaway of the lithium-ion battery 9, and facilitates the replacement of different extrusion punches 8. Limited by the limit sleeve 4 on the support 5, the main shaft 3 can move only in a vertical direction.

In this embodiment, the clamping claw plate 6 includes a first half and a second half separated from each other, and a lower end of the main shaft 3 and the first half of the clamping claw plate are fixedly connected to each other and are integrally formed. The first half and the second half form an inverted U-shaped slot after being fitted together. Inner walls of two sides of the slot are each provided with a protrusion. The extrusion punch 8 is provided with grooves, an upper part of the extrusion punch 8 is embedded in the slot, and the protrusions are engaged in the corresponding grooves.

The first half and the second half are provided with connecting through holes, respectively, and the bolt 7 is passed through the connecting through holes and then connected to a nut to fasten the extrusion punch 8 and the clamping claw plate 6 together. In this way, a firm connection and high structural stability are achieved, and the detachable connection between the extrusion punch 8 and the clamping claw plate 6 facilitates the mounting, removal, and replacement of the extrusion punch.

The lithium-ion battery 9 is placed and fixed in the groove of the heating plate 10 on the base 11, and the weight of the weight 1 is transferred by the main shaft 3 and the extrusion punch 8 to uniformly act on the lithium-ion battery 9. By replacing the weight 1 with weights having different weights, the application of different pressure values can be realized.

Referring to FIG. 3 to FIG. 4, the pressure sensor 19, a heat insulating layer 18, the laser distance sensor 15, and the heating plate 10 are arranged on the base 11. An upper surface of the base 11 is provided with a recess. The heating plate and the pressure sensor are embedded in the recess. The heating plate 10 is located above the pressure sensor 19, and the heat insulating layer 18 is arranged between the heating plate and the pressure sensor, to prevent the heating plate 10 from heating the pressure sensor 19, so as to prevent the pressure sensor 19 from exceeding its operating temperature to lead to inaccurate measurement. A temperature sensor is installed inside the heating plate 10, so that heating power can be controlled by the PID temperature controller 27 to achieve constant-temperature heating.

An edge of the heating plate 10 is folded upward to form a limit flange, and the lithium-ion battery is arranged on the heating plate and is fixed by the limit flange, to prevent the lithium-ion battery from sliding during the pressure loading process. The heating plate 10, the heat insulating layer 18, and the pressure sensor 19 adopt a replaceable design, and can be replaced according to different heating areas and different pressures applied.

The laser distance sensor 15 is fixed on one side of the base 11, and on the same side, a horizontal wing 16 is designed on the clamping claw plate 6. The relative distance between the clamping claw plate 6 and the base 11 is measured by measuring the change in the relative distance between the laser distance sensor 15 and the wing 16, so as to determine the amount of deformation of the lithium-ion battery 9 in the squeezed state and the change of the amount of deformation with the experimental process. Such a design is advantageous in that the sophisticated and expensive laser distance sensor 15 is arranged at a position far away from the lithium-ion battery, so that the laser distance sensor 15 can be protected from high temperature and smoke caused by thermal runaway of the lithium-ion battery 9.

Referring to FIG. 4, two sides of the extrusion punch 8 are provided with grooves which can engage with protrusions on an inner side of the clamping claw plate 6 to make the clamping more stable. Side walls of the clamping claw plate 6 are each provided with a connecting through hole through which the bolt 7 is passed to fix the clamping claw plate 6 and the extrusion punch 8. A hole is formed inside the extrusion punch 8 by drilling for placing the thermocouple 17, so that the temperature measuring head of the thermocouple 17 can come into contact with the surface of the lithium-ion battery through the hole in the squeezed state to measure the surface temperature of the lithium-ion battery 9. The extrusion punch 8 is designed to be detachable, and extrusion punches of different shapes can be used as required to study the influence of the extrusion of objects of different shapes on the lithium-ion battery on the safe operating window of the lithium-ion battery.

Figure 11:
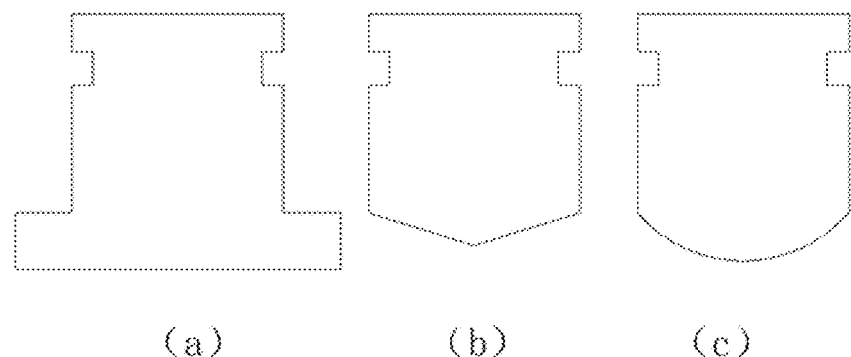
FIG. 11 is a structural view of three extrusion punches of different shapes, where (a) is a structural view of an extrusion punch having a flat bottom surface, and (b) is a structural view of an extrusion punch having a tapered bottom surface, and (c) is a structural view of an extrusion punch having a spherical bottom surface.
Figure 12:
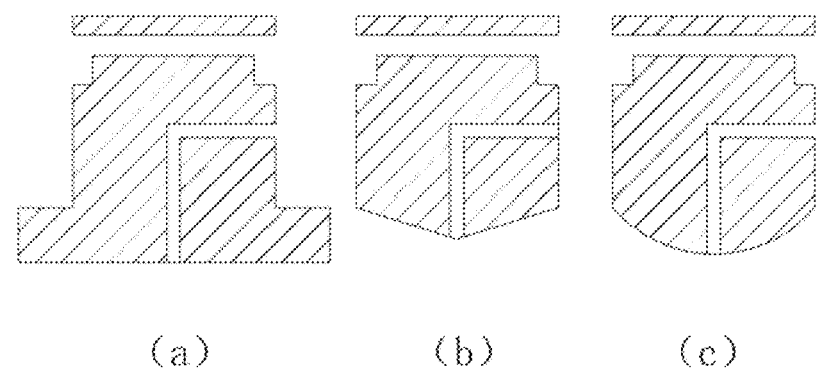
FIG. 12 is a cross-sectional view of the extrusion punches in FIG. 11, where (a) is a cross-sectional view taken along an axis shown in (a) of FIG. 11, and (b) is a cross-sectional view taken along an axis shown in (b) of FIG. 11, and (c) is a cross-sectional view taken along an axis shown in (c) of FIG. 11.

Refer to FIG. 11 to FIG. 12, where (a), (b) and (c) of FIG. 12 are cross-sectional views corresponding to (a), (b) and (c) of FIG. 11, respectively. In the present invention, three types of extrusion punches 8 of different shapes are designed. The first type has a flat contact surface. As shown in (a) of FIG. 11, this type can be used for studying the safe operating window of the lithium-ion battery under a uniform load. The second type has an angular contact surface. As shown in (b) of FIG. 11, this type can be used for studying the safe operating window of the lithium-ion battery in a state of being squeezed by a sharp hard object. The third type has a spherical contact surface. As shown in (c) of FIG. 11, this type can be used for studying the safe operating window of the lithium-ion battery in a state of being squeezed by a hard object having a spherical surface. By using the three extrusion punches of different shapes, it is possible to comprehensively study the influence of different contact surface shapes on the safe operating window of the lithium-ion battery, making the study more comprehensive and applicable to more actual situations. Drilling inside the extrusion head is to facilitate the installation of the thermocouple, so that the temperature of the squeezing contact surface during the experiment can be directly measured, so as to provide data support for the subsequent mechanism analysis.

In this embodiment, the lithium-ion battery tester is a Model G310A precision lithium-ion battery tester manufactured by Wuhan LAND Electronic Co. Ltd., which can implement synchronous current and voltage monitoring in a case where the lithium-ion battery is loaded with a fixed electrical load. The PID temperature controller is a Model LU-920 temperature controller manufactured by Anthone Electronic Co., Ltd. The model of the data acquisition device is Penghe TD-4017+. The above-mentioned devices are existing devices and will not be described in detail here.

The influence of a fixed mechanical pressure on the safe operating window of the lithium-ion battery is tested based on the testing system for a safe operating window of a lithium-ion battery in a squeezed state. The testing method includes the following steps.

Figure 13:
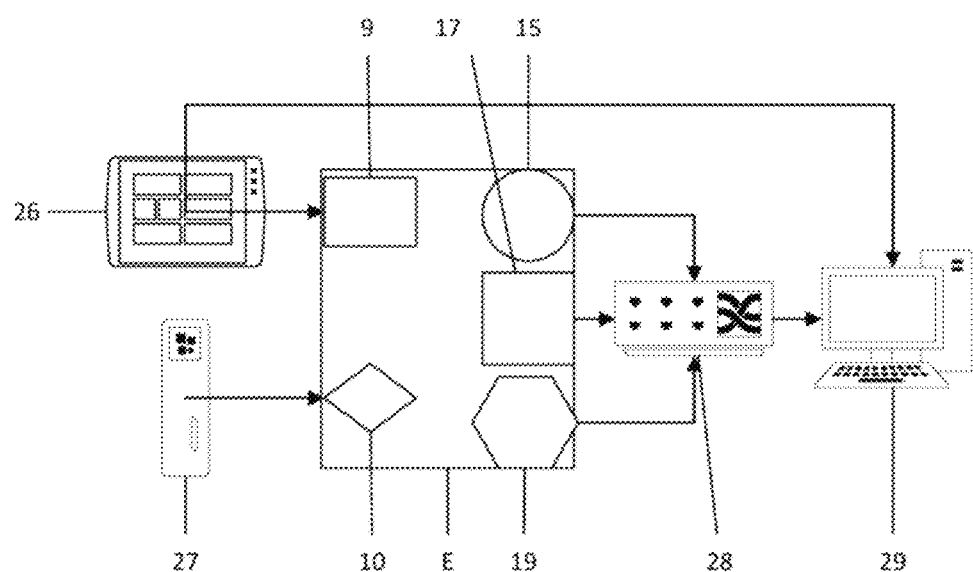
FIG. 13 is a block diagram of a testing system for a safe operating window of a lithium-ion battery in a squeezed state with a fixed mechanical pressure according to the present invention.

1) Referring to FIG. 13 where E in the figure represents an area corresponding to E in FIG. 3, the components of the devices in the present invention are connected in the following manner. Connecting the positive and negative electrodes of the lithium-ion battery 9 to the lithium-ion battery tester 26, to use the lithium-ion battery tester 26 to provide the lithium-ion battery with an electrical load required for the experiment and measure voltage and current information of the lithium-ion battery, and then connecting the lithium-ion battery tester 26 to the computer 29, to use the computer to record information about voltage and current changes during the experiment. Connecting the heating plate 10 to the PID temperature controller 27, and connecting the thermocouple inside the heating plate to the PID temperature controller 27, so that the PID temperature controller 27 controls heating temperature to achieve constant-temperature heating. Connecting the thermocouple 17, the laser distance sensor 15, and the pressure sensor 19 in the extrusion punch 8 to the data acquisition device 28, so that the data acquisition device 28 reads the measured values of the sensors, and connecting the data acquisition device 28 to the computer 29 to store and display data obtained through measurement by the sensors during the experiment. In the experiment, after a required mechanical load is loaded to provide required mechanical abuse conditions, the PID temperature controller 27 and the lithium-ion battery tester 26 are used to adjust the thermal load and electrical load loaded on the lithium-ion battery 9 to create suitable thermal abuse and electrical abuse conditions, so as to measure the thermal runaway time, temperature change, thickness change, weight change and other parameters of the lithium-ion battery under different schemes, and qualitatively and quantitatively analyze whether the lithium-ion battery undergoes a thermal runaway under different abuse conditions as well as the degree of thermal runaway. Through a large number of experiments, data on the critical conditions of thermal runaway of the lithium-ion battery can be obtained, and then the safe operating window for thermal runaway of the lithium-ion battery and hazards of thermal runaway can be quantitatively determined, providing reliable data support for the determination of conditions for the safe use of lithium-ion batteries.

2) A weight of the weight 1 to be placed on the tray 2 is calculated according to a value of pressure that needs to be applied, by using the following calculation formula:

$$M = \frac{p \cdot S}{g} - m \qquad (1)$$

Wherein, M is the weight of the weight 1 to be selected, p is the value of the pressure that needs to be applied, S is the contact area between the lithium-ion battery 9 and the extrusion punch 8 and is known, g is the acceleration of gravity and is known, and m is a sum of weights of the main shaft 3, the extrusion punch 8, the clamping claw plate 6, the bolt 7, and the tray 2, and is known.

3) Influence of a fixed mechanical pressure on the safe operating window of the lithium-ion battery is tested.

3.1) Influence of a combined action of mechanical abuse and thermal abuse on the safe operating window in a state with the fixed mechanical pressure is tested. Turning on the heating plate 10, adjusting the set heating temperature of the PID temperature controller according to requirements, recording a surface temperature of the lithium-ion battery during the test by using the thermocouple 17, recording, by using the laser distance sensor 15, a change in the relative distance between the clamping claw plate 6 and the base 11 caused by a change in thickness of the lithium-ion battery during the test, and recording a pressure variation during the test by using the pressure sensor 19, where the pressure variation is used for calculating a change in weight of the lithium-ion battery during the test. As the lithium-ion battery is squeezed, the internal jelly roll structure of the lithium-ion battery undergoes a certain deformation. In the case of thermal abuse, the chemical changes inside the lithium-ion battery cause further damage to the internal structure, and the mechanical squeezing causes the lithium-ion battery to experience a larger destructive force caused by thermal abuse, and thermal runaway will occur earlier. Because the lithium-ion battery is squeezed, the tendency of bulging to reduce the internal pressure under the action of the gas produced by the additional reaction inside the lithium-ion battery caused by thermal abuse is suppressed. As a result, the internal pressure of the lithium-ion battery continues to rise, and thermal runaway will occur earlier.

3.2) Influence of a combined action of mechanical abuse and electrical abuse on the safe operating window in a state with fixed mechanical pressure is tested. Turning on the lithium-ion battery tester 26, performing high-rate charging, high-rate discharging, overcharging, overdischarging or other electrical abuse on the lithium-ion battery according to requirements, recording a surface temperature of the lithium-ion battery during the test by using the thermocouple 17, recording, by using the laser distance sensor, a change in the relative distance between the clamping claw plate 6 and the base 11 caused by a change in thickness of the lithium-ion battery during the test, and recording a pressure variation during the test by using the pressure sensor 19, where the pressure variation is used for calculating a change in weight of the lithium-ion battery during the test. As the lithium-ion battery is squeezed, the internal jelly roll structure of the lithium-ion battery undergoes a certain deformation. In the case of electrical abuse, the chemical changes inside the lithium-ion battery cause further damage to the internal structure, the mechanical squeezing makes the distances between the internal layers of the lithium-ion battery closer and the internal stress greater, which is more likely to lead to the formation of lithium dendrites during charging and discharging. Such lithium dendrites will pierce the separator between the positive and negative electrode plates of the lithium-ion battery, leading to thermal runaway of the lithium-ion battery. Because the lithium-ion battery is squeezed, the internal pressure under the action of the gas produced by the additional reaction inside the lithium-ion battery caused by electrical abuse cannot be reduced by bulging. As a result, the internal pressure of the lithium-ion battery continues to rise, thermal runaway will occur earlier, and the thermal runaway temperature and speed increase.

3.3) Influence of a combined action of mechanical abuse, electrical abuse, and thermal abuse on the safe operating window in the state with the fixed mechanical pressure is tested. Designing experimental schemes for electrical abuse values, heating power, and heating temperature of high-rate charging, high-rate discharging, overcharging and overdischarging according to requirements, setting the lithium-ion battery tester 26 and the PID temperature controller 27 according to parameters of the experimental schemes, then carrying out experiments, recording a surface temperature of the lithium-ion battery during the test by using the thermocouple 17, recording, by using the laser distance sensor, a change in the relative distance between the clamping claw plate 6 and the base 11 caused by a change in thickness of the lithium-ion battery during the test, and recording a pressure variation during the test by using the pressure sensor 19, where the pressure variation is used for calculating a change in weight of the lithium-ion battery during the test. The combined action of the three forms of abuse makes the use environment of lithium-ion batteries worse. Under the combined action of the three forms of abuse, lithium-ion batteries will reach the thermal runaway temperature more quickly, with higher thermal runaway speed and intensity.

Embodiment 2

Referring to FIG. 4 to FIG. 10, a testing system for a safe operating window of a lithium-ion battery in a squeezed state with a fixed mechanical deformation is the same as the system in Embodiment 1 except for the pressure applying mechanism, so the details will not be repeated here for the same parts.

The pressure applying mechanism includes a top plate 21, four screws 20 vertically arranged, one driving gear 23, and four driven gears 22.

A lower end of each of the screws is fixedly connected to the base 11. The top plate 21 is provided with first mounting holes, and the number of the first mounting holes is the same as that of the screws 20. The top plate 21 is sleeved on the screws through the first mounting holes, and each of the screws extends through a corresponding first mounting hole. A bottom surface of the top plate 21 is fixedly connected to the first half of the clamping claw plate 6, and the top plate 21 and the first half of the clamping claw plate 6 are integrally formed.

A center of each of the driven gears 22 is provided with a threaded hole. Each of the driven gears 22 is sleeved on a corresponding screw through the threaded hole. The driven gears 22 are located on the top plate 21 and are rotatably connected to the top plate 21, and the driving gear meshes with all the driven gears 22.

Figure 7:
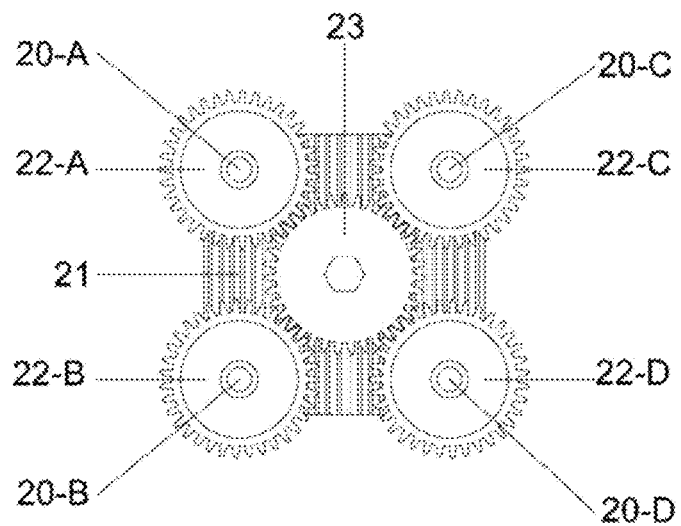
FIG. 7 is a top view of FIG. 5.

Referring to FIG. 7, four screws 20 perpendicular to the base are arranged in a square configuration on the base 11 of the fixed mechanical deformation loading device of the present invention. Each screw 20 is provided thereon with a corresponding driven gear 22. The four screws are marked as 20-A, 20-B, 20-C and 20-D respectively. Threads of the four screws are all left-handed threads. The corresponding four driven gears are marked as 22-A, 22-B, 22-C and 22-D respectively. Internal threads of the four driven gears are also left-handed threads. The driving gear 23 is arranged in the center of the four driven gears 22. The driving gear meshes with the four driven gears 22, so that the four driven gears 22 can synchronously rotate along with the rotation of the driving gear 23 in the center to ensure that the top plate 21 descends or raises evenly. The configuration of the left-handed threads of the four screws is for the purpose of causing, when the driving gear 23 rotates clockwise, the four driven gears to rotate counterclockwise to move the top plate 21 downward, which conforms to the normal usage habit of rotating rightward for descending. The driving gear 23 is designed with an inner hexagonal groove, and can be rotated by an inner hexagonal wrench. To adjust the distance by which the top plate 21 presses downward, one only needs to use an inner hexagonal wrench to rotate the driving gear 23 clockwise, and correspondingly the four driven gears 22 rotate counterclockwise synchronously and cause the top plate 21 to descend evenly, so as to ensure the uniformity of application of pressure on the lithium-ion battery, thereby ensuring the high repeatability of the experimental variables.

Figure 8:
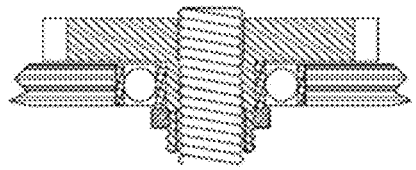
FIG. 8 is an exploded cross-sectional view showing connection between the top plate, screws and driven gears.
Figure 9:
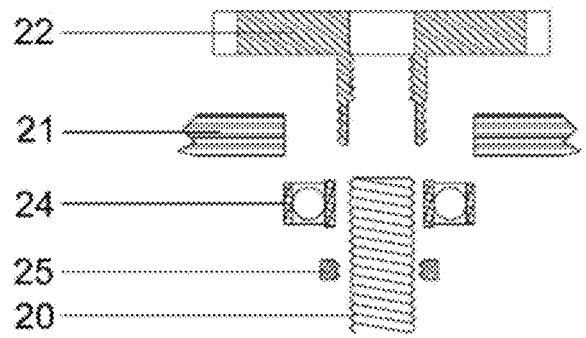
FIG. 9 is an exploded view of FIG. 8.

Referring to FIG. 8 to FIG. 9, FIG. 8 is an exploded cross-sectional view showing connection between the top plate, screws and driven gears, and FIG. 9 is an exploded view of FIG. 8. An edge of the threaded hole of each of the driven gears 22 protrudes downward and extends to form a connecting sleeve. The connecting sleeve is inserted into the corresponding first mounting hole and is rotatably connected to the top plate by a rolling bearing 24. An inner ring of the rolling bearing is fixedly sleeved on the connecting sleeve, and an outer ring of the rolling bearing is engaged in the first mounting hole. The rotatable connection between the driven gears 22 and the top plate reduces the friction between the driven gears 22 and the top plate, thereby reducing energy consumption and improving the operability.

The connecting sleeve includes an upper sleeve and a lower sleeve. An inner hole of the upper sleeve is a threaded hole and is threadedly connected to the corresponding screw, and the rolling bearing is sleeved on the upper sleeve. The lower sleeve extends out of the top plate 21, and an inner hole of the lower sleeve is an unthreaded hole having a diameter larger than a diameter of the inner hole of the upper sleeve. An outer wall of the lower sleeve is provided with an external thread, a limit cap 25 is sleeved on the lower sleeve, and the limit cap is threadedly connected to the lower sleeve, to prevent detachment of the driven gears 22 and the top plate, thereby improving the structural stability.

Figure 10:
FIG. 10 is a cross-sectional view showing connection between the driving gear and the top plate in FIG. 7.

Referring to FIG. 10, a tenon-and-mortise structure for limiting is used at the joint between the driving gear 23 in the center and the top plate 21. A center of a bottom of the driving gear 23 protrudes downward to form a cylindrical connecting body. An upper surface of the top plate 21 is recessed at a position corresponding to the cylindrical connecting body to form a cylindrical cavity. The cylindrical connecting body is inserted into the cylindrical cavity. The driving gear 23 is rotatably connected to the top plate 21, and the cylindrical connecting body and the cylindrical cavity are in sliding friction with each other at an interface therebetween where a lubricant is used for lubrication. The cylindrical connecting body and the cylindrical cavity limit each other to ensure the stability of the driving gear 23 during rotation.

The influence of a mechanical deformation on the safe operating window of the lithium-ion battery is tested based on the testing system for a safe operating window of a lithium-ion battery in a squeezed state. The testing method includes the following steps.

1) Referring to FIG. 13, the components of the devices in the present invention are connected in the following manner. Placing the lithium-ion battery 9 in the groove on the heating plate 10, and connecting positive and negative electrodes of the lithium-ion battery to the lithium-ion battery tester. Connecting the heating plate 10 to a power supply and the temperature controller, connecting the pressure sensor 19 and the laser distance sensor 15 to the data acquisition device, and placing the assembly of the extrusion punch 8 assembled with the thermocouple 17 and the top plate 21 gently on a surface of the lithium-ion battery. At a current time, a distance value measured by the laser distance sensor 15 and a pressure value measured by the pressure sensor 19 are recorded. The top plate 21 is provided with holes at positions corresponding to the fixing screws 20. Then the driving gear 23 is rotated, feed of the four driven gears 22 is adjusted to adjust a relative variation of a distance of the laser distance sensor 15 so that a mechanical deformation of the lithium-ion battery reaches a target value, and a thermal runaway boundary of the lithium-ion battery under the fixed mechanical deformation is tested. The test process is as follows.

2) Influence of the fixed mechanical deformation on the safe operating window of the lithium-ion battery is tested.

2.1) Influence of a combined action of mechanical abuse and thermal abuse on the safe operating window of the lithium-ion battery in the state with the fixed mechanical deformation is tested. Turning on the heating plate 10, adjusting a set heating temperature of the PID temperature controller according to requirements, recording a surface temperature of the lithium-ion battery during the test by using the thermocouple 17, recording, by using the laser distance sensor 15, a change in the relative distance between the clamping claw plate 6 and the base 11 caused by a change in thickness of the lithium-ion battery during the test, and recording a pressure variation during the test by using the pressure sensor 19, where the pressure variation is used for analyzing a strain caused by chemical reactions inside the lithium-ion battery during the test. As the lithium-ion battery deforms, the internal jelly roll structure of the lithium-ion battery also undergoes a certain deformation. In the case of thermal abuse, the chemical changes inside the lithium-ion battery cause further damage to the internal structure, and the mechanical squeezing causes the lithium-ion battery to experience a larger destructive force caused by thermal abuse, and thermal runaway will occur earlier. Because the thickness of the lithium-ion battery cannot be changed, the internal pressure under the action of the gas produced by the additional reaction inside the lithium-ion battery caused by thermal abuse cannot be reduced by bulging. As a result, the internal pressure of the lithium-ion battery continues to rise, thermal runaway will occur earlier, and explosion will occur earlier.

2.2) Influence of a combined action of mechanical abuse and electrical abuse on the safe operating window of the lithium-ion battery in the state with the fixed mechanical deformation is tested. Turning on the lithium-ion battery tester 26, performing high-rate charging, high-rate discharging, overcharging, overdischarging or other electrical abuse on the lithium-ion battery according to requirements, recording a surface temperature of the lithium-ion battery during the test by using the thermocouple 17, recording, by using the laser distance sensor, a change in the relative distance between the clamping claw plate 6 and the base 11 caused by a change in thickness of the lithium-ion battery during the test, and recording a pressure variation during the test by using the pressure sensor 19, where the pressure variation is used for analyzing a strain caused by chemical reactions inside the lithium-ion battery during the test. As the lithium-ion battery deforms, the internal jelly roll structure of the lithium-ion battery undergoes a deformation, and the distances between the internal layers of the lithium-ion battery are reduced. In the case of electrical abuse, the chemical changes inside the lithium-ion battery cause further damage to the internal structure, and the internal stress is increased, which is more likely to lead to the formation of lithium dendrites during charging and discharging. Such lithium dendrites will pierce the separator between the positive and negative electrode plates of the lithium-ion battery, leading to thermal runaway of the lithium-ion battery. Because the thickness of the lithium-ion battery cannot be changed, the internal pressure under the action of the gas produced by the additional reaction inside the lithium-ion battery caused by electrical abuse cannot be reduced by bulging. As a result, the internal pressure of the lithium-ion battery continues to rise, thermal runaway will occur earlier, and the thermal runaway temperature and speed increase.

2.3) Influence of a combined action of mechanical abuse, electrical abuse, and thermal abuse on the safe operating window of the lithium-ion battery in the state with the fixed mechanical deformation is tested. Designing experimental schemes for electrical abuse values, heating power, and heating temperature of high-rate charging, high-rate discharging, overcharging and overdischarging according to requirements, setting the lithium-ion battery tester 26 and the PID temperature controller 27 according to parameters of the experimental schemes, then carrying out experiments, recording a surface temperature of the lithium-ion battery during the test by using the thermocouple 17, recording, by using the laser distance sensor, a change in the relative distance between the clamping claw plate 6 and the base 11 caused by a change in thickness of the lithium-ion battery during the test, and recording a pressure variation during the test by using the pressure sensor 19, where the pressure variation is used for analyzing a strain caused by chemical reactions inside the lithium-ion battery during the test. The combined action of the three forms of abuse makes the use environment of lithium-ion batteries worse. Under the combined action of the three forms of abuse, lithium-ion batteries will reach the thermal runaway temperature more quickly, with higher thermal runaway speed and intensity.

By comparing the influence of the combined use of two or more of mechanical abuse with two different fixed variables, thermal abuse and electrical abuse on critical conditions of thermal runaway of the lithium-ion battery in Embodiments 1 and 2, the influence of the different forms of abuse on the critical conditions of thermal runaway of the lithium-ion battery can be compared qualitatively and quantitatively, and these data can also be used to determine the safe operating windows of the lithium-ion battery under different abuse conditions, thereby providing data support for the safe use of lithium-ion batteries in life, and providing a basis for analysis of thermal runaway accidents of lithium-ion batteries in life.

It should be understood that the specific examples described herein are merely provided for illustrating, instead of limiting the present invention. Any modifications and equivalent improvements and substitutions can be made thereto without departing from the spirit and principle of the present invention, which all fall within the protection scope of the present invention.

What is claimed is:

1. A testing system for a safe operating window of a lithium-ion battery in a squeezed state, the testing system comprising:
    a mechanical loading device, wherein the mechanical loading device comprises a base, an extrusion punch, a clamping claw plate, and a pressure applying mechanism arranged on the base, the clamping claw plate is configured to clamp the extrusion punch, and the pressure applying mechanism is configured to apply a pressure to the lithium-ion battery through the extrusion punch;
    a heating device, wherein the heating device comprises a heating plate and a proportional-integral-derivative (PID) temperature controller, the PID temperature controller is connected to the heating plate by a wire, the heating plate is located on the base, and the lithium-ion battery is placed on the heating plate;
    a lithium-ion battery tester, wherein the lithium-ion battery tester is connected to positive and negative electrodes of the lithium-ion battery by wires; and
    a measuring device, wherein the measuring device comprises a first thermocouple configured to measure a temperature of the lithium-ion battery, a laser distance sensor configured to measure a compressional deformation of the lithium-ion battery, a pressure sensor configured to measure a pressure value experienced by the lithium-ion battery, a data acquisition device, and a computer; the first thermocouple, the laser distance sensor, and the pressure sensor are all connected to the data acquisition device by wires, and the lithium-ion battery tester and the data acquisition device are connected to the computer by wires,
    wherein the clamping claw plate comprises a first half and a second half separated from each other, the first half and the second half form an inverted U-shaped slot after being fitted together, inner walls of two sides of the inverted U-shaped slot are each provided with a protrusion; the extrusion punch is provided with grooves, an upper part of the extrusion punch is embedded in the inverted U-shaped slot, and the protrusion is engaged in a respective one of the grooves, the first half and the second half are provided with connecting through holes, respectively, and a bolt is passed through the connecting through holes and then connected to a nut to fasten the extrusion punch and the clamping claw plate together,
    in order to test the safe operating window of the lithium-ion battery in the squeezed state with a fixed mechanical pressure, the pressure applying mechanism comprises a weight, a tray, a main shaft, at least one limit sleeve, and a support,
    the support is fixedly connected to the base, the limit sleeve is arranged on the support, the main shaft is movably connected to the support by the limit sleeve, the main shaft is arranged vertically, the main shaft is movable up and down along the support, an upper end of the main shaft is connected to the tray, and the weight is placed in the tray; and a lower end of the main shaft and the first half of the clamping claw plate are fixedly connected to each other and are integrally formed.

2. The testing system for the safe operating window of the lithium-ion battery in the squeezed state according to claim 1, wherein in order to test the safe operating window of the lithium-ion battery in the squeezed state with a fixed mechanical deformation, the pressure applying mechanism comprises a top plate, at least two screws vertically arranged, one driving gear, and driven gears, and a number of the driven gears is identical to a number of the screws;
    a lower end of each of the screws is fixedly connected to the base, the top plate is provided with first mounting holes, a number of the first mounting holes is identical to the number of the screws, the top plate is sleeved on the screws through the first mounting holes, and each of the screws extends through a respective one of the first mounting holes; a bottom surface of the top plate is fixedly connected to the first half of the clamping claw plate, and the top plate and the first half of the clamping claw plate are integrally formed; and
    a center of each of the driven gears is provided with a threaded hole, each of the driven gears is sleeved on a respective one of the screws through the threaded hole, the driven gears are located on the top plate and are rotatably connected to the top plate, and the driving gear meshes with all the driven gears.

3. The testing system for the safe operating window of the lithium-ion battery in the squeezed state according to claim 2, wherein an edge of the threaded hole of each of the driven gears protrudes downward and extends to form a connecting sleeve, and the connecting sleeve is inserted into the respective one of the first mounting holes and is rotatably connected to the top plate by a rolling bearing, wherein an inner ring of the rolling bearing is fixedly sleeved on the connecting sleeve, and an outer ring of the rolling bearing is engaged in the respective one of the first mounting holes.

4. The testing system for the safe operating window of the lithium-ion battery in the squeezed state according to claim 3, wherein the connecting sleeve comprises an upper sleeve and a lower sleeve, wherein an inner hole of the upper sleeve is a threaded hole and is threadedly connected to the respective one of the screws, and the rolling bearing is sleeved on the upper sleeve; the lower sleeve extends out of the top plate, an inner hole of the lower sleeve is an unthreaded hole having a diameter larger than a diameter of the inner hole of the upper sleeve, an outer wall of the lower sleeve is provided with an external thread, a limit cap is sleeved on the lower sleeve, and the limit cap is threadedly connected to the lower sleeve.

5. The testing system for the safe operating window of the lithium-ion battery in the squeezed state according to claim 4, wherein a center of a bottom of the driving gear protrudes downward to form a cylindrical connecting body, an upper surface of the top plate is recessed at a position corresponding to the cylindrical connecting body to form a cylindrical cavity, the cylindrical connecting body is inserted into the cylindrical cavity, the cylindrical connecting body and the cylindrical cavity are in sliding friction with each other at an interface therebetween where a lubricant is used for lubrication, and the driving gear is rotatably connected to the top plate.

6. The testing system for the safe operating window of the lithium-ion battery in the squeezed state according to claim 5, wherein a lower end of the extrusion punch is provided with a second mounting hole, the first thermocouple is arranged in the second mounting hole, and during testing, the first thermocouple is in contact with a surface of the lithium-ion battery; and the second half of the clamping claw plate extends horizontally outward to form a wing having a light shielding function, the laser distance sensor is fixedly arranged on the base, and a laser emitted from an emitting end of the laser distance sensor is reflected by the wing and then received by a receiving end of the laser distance sensor.

7. The testing system for the safe operating window of the lithium-ion battery in the squeezed state according to claim 6, wherein an upper surface of the base is provided with a recess, the heating plate and the pressure sensor are embedded in the recess, the heating plate is located above the pressure sensor, a heat insulating layer is arranged between the heating plate and the pressure sensor, an edge of the heating plate is folded upward to form a limit flange, and the lithium-ion battery is arranged on the heating plate and is fixed by the limit flange.

8. The testing system for the safe operating window of the lithium-ion battery in the squeezed state according to claim 4, wherein lower end of the extrusion punch is provided with a second mounting hole, the first thermocouple is arranged in the second mounting hole, and during testing, the first thermocouple is in contact with a surface of the lithium-ion battery; and the second half of the clamping claw plate extends horizontally outward to form a wing having a light shielding function, the laser distance sensor is fixedly arranged on the base, and a laser emitted from an emitting end of the laser distance sensor is reflected by the wing and then received by a receiving end of the laser distance sensor.

9. The testing system for the safe operating window of the lithium-ion battery in the squeezed state according to claim 8, wherein an upper surface of the base is provided with a recess, the heating plate and the pressure sensor are embedded in the recess, the heating plate is located above the pressure sensor, a heat insulating layer is arranged between the heating plate and the pressure sensor, an edge of the heating plate is folded upward to form a limit flange, and the lithium-ion battery is arranged on the heating plate and is fixed by the limit flange.

10. The testing system for the safe operating window of the lithium-ion battery in the squeezed state according to claim 3, wherein lower end of the extrusion punch is provided with a second mounting hole, the first thermocouple is arranged in the second mounting hole, and during testing, the first thermocouple is in contact with a surface of the lithium-ion battery; and the second half of the clamping claw plate extends horizontally outward to form a wing having a light shielding function, the laser distance sensor is fixedly arranged on the base, and a laser emitted from an emitting end of the laser distance sensor is reflected by the wing and then received by a receiving end of the laser distance sensor.

11. The testing system for the safe operating window of the lithium-ion battery in the squeezed state according to claim 10, wherein an upper surface of the base is provided with a recess, the heating plate and the pressure sensor are embedded in the recess, the heating plate is located above the pressure sensor, a heat insulating layer is arranged between the heating plate and the pressure sensor, an edge of the heating plate is folded upward to form a limit flange, and the lithium-ion battery is arranged on the heating plate and is fixed by the limit flange.

12. The testing system for the safe operating window of the lithium-ion battery in the squeezed state according to claim 2, wherein lower end of the extrusion punch is provided with a second mounting hole, the first thermocouple is arranged in the second mounting hole, and during testing, the first thermocouple is in contact with a surface of the lithium-ion battery; and the second half of the clamping claw plate extends horizontally outward to form a wing having a light shielding function, the laser distance sensor is fixedly arranged on the base, and a laser emitted from an emitting end of the laser distance sensor is reflected by the wing and then received by a receiving end of the laser distance sensor.

13. The testing system for the safe operating window of the lithium-ion battery in the squeezed state according to claim 12, wherein an upper surface of the base is provided with a recess, the heating plate and the pressure sensor are embedded in the recess, the heating plate is located above the pressure sensor, a heat insulating layer is arranged between the heating plate and the pressure sensor, an edge of the heating plate is folded upward to form a limit flange, and the lithium-ion battery is arranged on the heating plate and is fixed by the limit flange.

14. A testing method using the testing system for the safe operating window of the lithium-ion battery in the squeezed state according to claim 2, the testing method comprising the following steps:

step 1: placing the lithium-ion battery on the heating plate, and connecting the positive and negative electrodes of the lithium-ion battery to the lithium-ion battery tester, to implement synchronous current and voltage monitoring in a case where the lithium-ion battery is loaded with a fixed electrical load; connecting the heating plate to a power supply and the PID temperature controller, and connecting the second thermocouple inside the heating plate to the PID temperature controller; connecting the pressure sensor and the laser distance sensor to the data acquisition device; connecting the extrusion punch assembled with the first thermocouple to the clamping claw plate, placing the extrusion punch on a surface of the lithium-ion battery, connecting the first thermocouple to the data acquisition device, connecting the data acquisition device and the lithium-ion battery tester to the computer, and recording real-time measured values of the laser distance sensor and the pressure sensor that are respectively displayed on the computer;

step 2: testing an influence of a fixed mechanical pressure on the safe operating window of the lithium-ion battery: calculating a weight of the weight to be placed on the tray according to a value of a pressure that needs to be applied, by using the following calculation formula:

$$M = \frac{p \cdot S}{g} - m \quad (1)$$

wherein, M is the weight of the weight to be selected, p is the value of the pressure that needs to be applied, S is a contact area between the lithium-ion battery and the extrusion punch and is known, g is an acceleration of gravity and is known, and m is a sum of weights of the main shaft, the extrusion punch, the clamping claw plate, the bolt, and the tray, and is known;

wherein the step 2 includes:

step 2.1: testing an influence of a combined action of a mechanical abuse and a thermal abuse on the safe operating window of the lithium-ion battery in the state with the fixed mechanical pressure:

turning on the heating plate by using the PID temperature controller, adjusting a set heating temperature of the PID temperature controller according to settings, and testing a surface temperature of the lithium-ion battery by using the first thermocouple; testing, by using the laser distance sensor, a variation in a relative distance between the clamping claw plate and the base caused by a change in thickness of the lithium-ion battery; testing, by using the pressure sensor, a pressure variation, wherein the pressure variation is used for calculating a change in weight of the lithium-ion battery;

step 2.2: testing an influence of a combined action of the mechanical abuse and an electrical abuse on the safe operating window of the lithium-ion battery in the state with the fixed mechanical pressure:

turning on the lithium-ion battery tester, performing four electrical abuses comprising high-rate charging, high-rate discharging, overcharging and overdischarging respectively on the lithium-ion battery according to settings, recording a surface temperature of the lithium-ion battery by using the first thermocouple, recording, by using the laser distance sensor, a change in the relative distance between the clamping claw plate and the base caused by a change in thickness of the lithium-ion battery, and recording a pressure variation by using the pressure sensor, wherein the pressure variation is used for calculating a change in weight of the lithium-ion battery;

step 2.3: testing an influence of a combined action of the mechanical abuse, the electrical abuse, and the thermal abuse on the safe operating window of the lithium-ion battery in the state with the fixed mechanical pressure:

designing experimental schemes according to required electrical abuse parameters of charging, discharging, overcharging and overdischarging, and thermal abuse parameters of heating power or heating temperature, setting the lithium-ion battery tester and the PID temperature controller according to parameters of the experimental schemes, then carrying out experiments, recording a surface temperature of the lithium-ion battery by using the first thermocouple, recording, by using the laser distance sensor, a change in the relative distance between the clamping claw plate and the base caused by a change in thickness of the lithium-ion battery, and recording a pressure variation by using the pressure sensor, wherein the pressure variation is used for calculating a change in weight of the lithium-ion battery;

step 3: testing an influence of a fixed mechanical deformation of the lithium-ion battery on the safe operating window of the lithium-ion battery: rotating the driving gear, adjusting feed of the driven gears to adjust a relative variation of a distance of the laser distance sensor so that a mechanical deformation of the lithium-ion battery reaches a target value, and then starting to test a thermal runaway boundary of the lithium-ion battery under the fixed mechanical deformation:

wherein the step 3 includes:

step 3.1: testing an influence of a combined action of the mechanical abuse and the thermal abuse on the safe operating window of the lithium-ion battery in a state with a fixed mechanical deformation:

turning on the heating plate by using the PID temperature controller, adjusting the set heating temperature of the PID temperature controller according to settings, and testing a surface temperature of the lithium-ion battery by using the first thermocouple; testing, by using the pressure sensor, a pressure variation, wherein the pressure variation is used for analyzing a strain caused by chemical reactions inside the lithium-ion battery;

step 3.2: testing an influence of a combined action of the mechanical abuse and the electrical abuse on the safe operating window of the lithium-ion battery in the state with the fixed mechanical deformation:

turning on the lithium-ion battery tester, performing four electrical abuses comprising high-rate charging, high-rate discharging, overcharging and overdischarging respectively on the lithium-ion battery according to settings, recording a surface temperature of the lithium-ion battery by using the first thermocouple; testing, by using the pressure sensor, a pressure variation, wherein the pressure variation is used for analyzing a strain caused by chemical reactions inside the lithium-ion battery;

step 3.3: testing an influence of a combined action of the mechanical abuse, the electrical abuse, and the thermal abuse on the safe operating window of the lithium-ion battery in the state with the fixed mechanical deformation:

designing experimental schemes for electrical abuse values, heating power, and heating temperature of high-rate charging, high-rate discharging, overcharging and overdischarging according to requirements, setting the lithium-ion battery tester and the PID temperature controller according to parameters of the experimental schemes, then carrying out experiments, recording a surface temperature of the lithium-ion battery by using the first thermocouple, and recording a pressure variation by using the pressure sensor, wherein the pressure variation is used for analyzing a strain caused by chemical reactions inside the lithium-ion battery.

* * * * *